(12) United States Patent
Cheng et al.

(10) Patent No.: US 11,158,787 B2
(45) Date of Patent: Oct. 26, 2021

(54) C—AS—SE—GE OVONIC MATERIALS FOR SELECTOR DEVICES AND MEMORY DEVICES USING SAME

(71) Applicant: MACRONIX INTERNATIONAL CO., LTD., Hsinchu (TW)

(72) Inventors: Huai-Yu Cheng, White Plains, NY (US); I-Ting Kuo, Taoyuan (TW); Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/716,948

(22) Filed: Dec. 17, 2019

(65) Prior Publication Data

US 2021/0184112 A1  Jun. 17, 2021

(51) Int. Cl.
*H01L 45/00* (2006.01)
*G11C 13/00* (2006.01)
*H01L 27/24* (2006.01)

(52) U.S. Cl.
CPC .......... *H01L 45/06* (2013.01); *G11C 13/0004* (2013.01); *G11C 13/0069* (2013.01); *H01L 27/2427* (2013.01); *H01L 45/143* (2013.01); *H01L 45/148* (2013.01)

(58) Field of Classification Search
CPC ... H01L 45/06; H01L 27/2427; H01L 45/143; H01L 45/148; G11C 13/0069; G11C 13/0004
See application file for complete search history.

(56) References Cited

U.S. PATENT DOCUMENTS

| | | |
|---|---|---|
| 3,271,591 A | 9/1966 | Ovshinsky |
| 3,343,034 A | 9/1967 | Ovshinsky |
| 3,571,669 A | 3/1971 | Fleming |
| 3,571,670 A | 3/1971 | Ovshinsky |
| 3,571,671 A | 3/1971 | Ovshinsky |
| 3,571,672 A | 3/1971 | Ovshinsky |
| 3,588,638 A | 6/1971 | Fleming et al. |
| 3,611,063 A | 10/1971 | Neale |
| 3,619,732 A | 11/1971 | Neale |

(Continued)

FOREIGN PATENT DOCUMENTS

| | | |
|---|---|---|
| CN | 1568494 A | 1/2005 |
| CN | 107210302 A | 9/2017 |

(Continued)

OTHER PUBLICATIONS

H. Y. Cheng et al., "An ultra high endurance and thermally stable selector based on TeAsGeSiSe chalcogenides compatible with BEOL IC Integration for cross-point PCM," 2017 IEEE International Electron Devices Meeting (IEDM), San Francisco, CA, USA, 2017, pp. 2.2.1-2.2.4 (Year: 2017).*

(Continued)

*Primary Examiner* — Jerome Leboeuf
(74) *Attorney, Agent, or Firm* — Haynes Beffel & Wolfeld LLP

(57) ABSTRACT

A voltage sensitive switching device has a first electrode, a second electrode, and a switching layer between the first and second electrodes, comprising a composition of carbon C, arsenic As, selenium Se and germanium Ge thermally stable to temperatures over 400° C. The switching device is used in 3D crosspoint memory.

18 Claims, 7 Drawing Sheets

(56) References Cited

U.S. PATENT DOCUMENTS

| | | | |
|---|---|---|---|
| 3,656,032 | A | 4/1972 | Henisch |
| 3,846,767 | A | 11/1974 | Cohen |
| 3,875,566 | A | 4/1975 | Helbers |
| 3,886,577 | A | 5/1975 | Buckley |
| 3,980,505 | A | 9/1976 | Buckley |
| 5,177,567 | A | 1/1993 | Klersy et al. |
| 5,687,112 | A | 11/1997 | Ovshinsky |
| 6,579,760 | B1 | 6/2003 | Lung |
| 6,800,504 | B2 | 10/2004 | Li et al. |
| 6,967,344 | B2 | 11/2005 | Ovshinsky et al. |
| 6,995,390 | B2 | 2/2006 | Tsukui |
| 7,483,293 | B2 | 1/2009 | Pinnow et al. |
| 7,688,619 | B2 | 3/2010 | Lung et al. |
| 7,902,538 | B2 | 3/2011 | Lung |
| 7,903,457 | B2 | 3/2011 | Lung |
| 7,929,340 | B2 | 4/2011 | Lung et al. |
| 8,138,028 | B2 | 3/2012 | Lung et al. |
| 8,148,707 | B2 | 4/2012 | Ovshinsky |
| 8,178,387 | B2 | 5/2012 | Cheng et al. |
| 8,315,088 | B2 | 11/2012 | Lung |
| 8,324,605 | B2 | 12/2012 | Lung et al. |
| 8,344,348 | B2 | 1/2013 | Wicker |
| 8,363,463 | B2 | 1/2013 | Shih et al. |
| 8,426,242 | B2 | 4/2013 | Cheng et al. |
| 8,467,236 | B2 | 6/2013 | Campbell |
| 8,634,235 | B2 | 1/2014 | Lung et al. |
| 8,772,747 | B2 | 7/2014 | Cheng et al. |
| 8,916,414 | B2 | 12/2014 | Cheng et al. |
| 8,932,901 | B2 | 1/2015 | Cheng |
| 8,946,666 | B2 | 2/2015 | Cheng et al. |
| 9,177,640 | B2 | 11/2015 | Shintani et al. |
| 9,214,229 | B2 | 12/2015 | Cheng et al. |
| 9,336,879 | B2 | 5/2016 | Lung et al. |
| 9,659,998 | B1 | 5/2017 | Lung |
| 9,917,252 | B2 | 3/2018 | Cheng et al. |
| 10,050,196 | B1 | 8/2018 | Cheng et al. |
| 10,157,671 | B1 | 12/2018 | Lung et al. |
| 10,256,406 | B2 | 4/2019 | Collins et al. |
| 10,374,009 | B1 | 8/2019 | Cheng et al. |
| 10,541,271 | B2 | 1/2020 | Cheng et al. |
| 10,593,875 | B2 | 3/2020 | Lai et al. |
| 2005/0018098 | A1 | 1/2005 | Sugihara et al. |
| 2011/0049456 | A1 | 3/2011 | Lung et al. |
| 2011/0095257 | A1 | 4/2011 | Xu et al. |
| 2012/0025164 | A1 | 2/2012 | Deweerd |
| 2012/0181499 | A1 | 7/2012 | Chuang et al. |
| 2013/0270505 | A1 | 10/2013 | Dahmani |
| 2014/0376307 | A1 | 12/2014 | Shintani |
| 2016/0276022 | A1 | 9/2016 | Redaelli |
| 2016/0336378 | A1 | 11/2016 | Ohba et al. |
| 2017/0244026 | A1* | 8/2017 | Wu ............... H01L 45/126 |
| 2017/0250222 | A1 | 8/2017 | Wu et al. |
| 2017/0263863 | A1 | 9/2017 | Lung et al. |
| 2017/0271581 | A1 | 9/2017 | Seong et al. |
| 2018/0012938 | A1 | 1/2018 | Lung et al. |
| 2018/0019391 | A1 | 1/2018 | Ohba et al. |
| 2018/0040669 | A1 | 2/2018 | Wu |
| 2019/0043924 | A1 | 2/2019 | Conti et al. |
| 2019/0081103 | A1 | 3/2019 | Fantini et al. |
| 2019/0148456 | A1 | 5/2019 | Wu et al. |
| 2019/0252609 | A1* | 8/2019 | Sei ............... H01L 45/08 |
| 2019/0355790 | A1 | 11/2019 | Lung et al. |
| 2019/0355903 | A1 | 11/2019 | Lung et al. |
| 2019/0386213 | A1 | 12/2019 | Lai et al. |
| 2019/0393268 | A1 | 12/2019 | Lai et al. |
| 2020/0052036 | A1 | 2/2020 | Ikarashi et al. |
| 2020/0295083 | A1 | 9/2020 | Cheng et al. |
| 2021/0111224 | A1 | 4/2021 | Cheng et al. |

FOREIGN PATENT DOCUMENTS

| | | |
|---|---|---|
| TW | 201633507 A | 9/2016 |
| TW | 201801300 A | 1/2018 |
| TW | 201907543 A | 2/2019 |

OTHER PUBLICATIONS

H. Y. Cheng et al., "Ultra-High Endurance and Low IOFF Selector based on AsSeGe Chalcogenides for Wide Memory Window 3D Stackable Crosspoint Memory," 2018 IEEE International Electron Devices Meeting (IEDM), San Francisco, CA, USA, 2018, pp. 37.3.1-37.3.4 (Year: 2018).*

H. Y. Cheng et al., "Si Incorporation into AsSeGe Chalcogenides for High Thermal Stability, High Endurance and Extremely Low Vth Drift 3D Stackable Cross-Point Memory," 2020 IEEE Symposium on VLSI Technology, Honolulu, HI, USA, 2020, pp. 1-2 (Year: 2020).*

Kao et al., "Antimony alloys for phase-change memory with high thermal stability," Scripta Materialia vol. 63, issue 8, Oct. 2010, 855-858.

Ohyanagi et al., "Special Electrical Characteristics of Superlattice Phase Change Memory," ECS Trans., vol. 58, Issue 5, Oct. 31, 2013, pp. 135-158.

Ovshinsky, "New Transformative Possibilities for Ovonic Devices," EPCOS2010, European Symposium on Phase Change and Ovonic Science, Milan, Italy Sep. 6-7, 2010, 9 pages.

Schuller, Ivan K., Stevens, Rick, Pino, Robinson, and Pechan, Michael. Neuromorphic Computing—From Materials Research to Systems Architecture Roundtable. "Report of a Roundtable Convened to Consider Neuromorphic Computing Basic Research Needs," Oct. 29-30, 2015, 40 pages.

Shanks, "Ovonic threshold switching characteristics," Journal of Non-Crystalline Solids, vol. 2, Jan. 1970, pp. 504-514.

Shin et al., "The effect of doping Sb on the electronic structure and the device characteristics of Ovonic Threshold Switches based on Ge—Se," Scientific Reports, Nov. 18, 2014, 5 pages.

Simpson et al., "Interfacial phase-change memory," Nature Nanotechnology, vol. 6, Jul. 3, 2011, 502-505.

Velea et al., "Te-based chalcogenide materials for selector applications," Scientific Reports, 7:8103, Aug. 14, 2019, 12 pages.

Guo et al., "A Review of Germanium-Antimony-Telluride Phase Change Materials for Non-Volatile Memories and Optical Modulators," Appl. Sci. Feb. 4, 2019, 26 pages; www.mdpi.com/journal/applsci.

Mark-Lapedus, "Embedded Phase-Change Memory Emerges," https://semiengineering.com/author/mark-lapedus, Jan. 24, 2019, 13 pages.

U.S. Appl. No. 16/716,948 "CAsSeGe Ovonic Materials for Selector Devices and Memory Devices Using Same ," filed Dec. 17, 2019, 26 pages.

U.S. Appl. No. 16/787,371 "Phase Change Memory with a Carbon Buffer Layer," filed Feb. 11, 2020, 22 pages.

Wikipedia, "Rutherford backscattering spectrometry," downloaded Aug. 4, 2020, available at https://en.wikipedia.org/wiki/Rutherford_backscattering_spectrometry, 8 pages.

Wu et al., "A 40nm Low-Power Logic Compatible Phase Change Memory Technology," IEEE IEDM 2018, Dec. 1-5, 2018, 4 pages.

NIST Special Publication 800-38D, Dworkin, "Recommendation for Block Cipher Modes of Operation: Galois/Counter Mode (GCM) and GMAC," Nov. 2007, 39 pages.

U.S. Office Action in U.S. Appl. No. 16/355,292 dated Mar. 1, 2021, 20 pages.

* cited by examiner

C—AS—SE—GE OVONIC MATERIALS FOR SELECTOR DEVICES AND MEMORY DEVICES USING SAME

BACKGROUND

Field

The present invention relates to switching devices utilized in integrated circuits, including integrated circuit memory devices.

Description of Related Art

There are many applications for switching devices, such as transistors and diodes, in integrated circuits. The emergence of new nonvolatile memory (NVM) technologies—such as phase change memory, resistive memory—has been motivated by exciting applications such as storage class memory, solid-state disks, embedded nonvolatile memory and neuromorphic computing. Many of these applications are suggested to be packed densely in vast "crosspoint" arrays which can offer many gigabytes.

In such arrays, access to any small subset of the array for accurate reading or low-power writing requires a strong nonlinearity in the IV characteristics, so that the currents passing through the selected devices greatly exceed the residual leakage through the nonselected devices. This nonlinearity can either be included explicitly, by adding a discrete access device at each crosspoint, or implicitly with an NVM device which also exhibits a highly nonlinear IV characteristic.

One type of switching device is known as the ovonic threshold switch, based on ovonic materials, characterized by a large drop in resistance at a switching threshold voltage, and recovery of a high resistance, blocking state when the voltage falls below a holding threshold.

Switching devices have been used, for example, in various programmable resistance memory devices comprising high density arrays of cells organized in a crosspoint architecture. Some crosspoint architectures utilize memory cells that include a phase change memory element or other resistive memory element in series with an ovonic threshold switch, for example. Other architectures are utilized, including a variety of 2-dimensional and 3-dimensional array structures, which can also utilize switching devices to select memory elements in the array. Also, ovonic threshold switches have been proposed for a variety of other uses, including so-called neuromorphic computing.

Thermal stability of materials used in integrated circuits can be an important characteristic. For example, in back end of line BEOL processing of integrated circuits, temperatures as high as 400° C. can be generated, which can exceed crystallization transition temperatures, or can degrade stability, of ovonic materials. In addition, in assembly of equipment, integrated circuits can be exposed to high temperatures during solder bonding or other high temperature assembly processes. Also, integrated circuits can be exposed to high temperature during operation in the field. For example, thermal stability of $GeTe_6$ material was low (<200° C.). It is believed for example that Te crystallizes first above 200° C. and is then followed by rhombohedral GeTe crystallization at 300° C., due to which serious phase separation is expected. Therefore, it unfortunately does not have the necessary thermal stability for BEOL CMOS integration.

It is desirable to provide a switching device with relatively high threshold voltages, low leakage current, fast switching speeds along with good thermal stability at temperatures encountered during manufacturing and during operation in the field.

SUMMARY

A voltage sensitive switching device is described comprising a first electrode, a second electrode, and a switching layer between the first and second electrodes, comprising a composition of carbon C, arsenic As, selenium Se and germanium Ge that is stable at temperatures above 400° C. A class of compositions is described useful as a switching layer in an integrated circuit, in which carbon C, arsenic As, selenium Se and germanium Ge are combined in amounts and with a thickness of the layer, effective to have a crystallization transition (measured for the purposes of this description by thermal cycling of a thin film) temperature in excess of 400° C.; in some embodiments a crystallization transition temperature in excess of 450° C.; and in some embodiments a crystallization transition temperature in excess of 500° C.

A class of compositions is described including arsenic As, selenium Se, germanium Ge and carbon C, with the C in a range of 10 at % to 30 at % of the composition. Materials are described herein include a sub-class including C in a range of 10 at % to 30 at %, arsenic As in a range of 20 at % to 35 at %, selenium Se in a range of 35 at % to 55 at % and germanium Ge in a range of 8 at % to 25 at %. In members of this class of compositions, the amounts of C, As, Se and Ge in a switching layer are combined in amounts and with a thickness of the layer, effective to have high thermal stability, and a high crystallization transition temperature.

Compositions are effective to switch with a threshold voltage, when control circuitry is configured for a threshold voltage, by applying a voltage to a selected switch so that the voltage on the switching layer in the selected switch is above the threshold voltage, and applying a voltage to an unselected switch so that the voltage on the switching layer in the unselected switch is below the threshold voltage during an operation accessing the selected switch.

A memory device is described that includes a first electrode, a second electrode, a memory element and a switching layer such as described above, in series with the memory element between the first and second electrodes. The memory device can include a barrier layer (also called a buffer layer) between the memory element and the switching layer. The memory device can be configured as a 3D crosspoint memory on an integrated circuit device, having very high density.

Also the switching device can be utilized in a variety of other kinds of devices.

Other aspects and advantages of the present invention can be seen on review of the drawings, the detailed description and the claims, which follow.

DETAILED DESCRIPTION

A detailed description of embodiments of the present invention is provided with reference to the FIGS. 1-11.

Figure 1A:
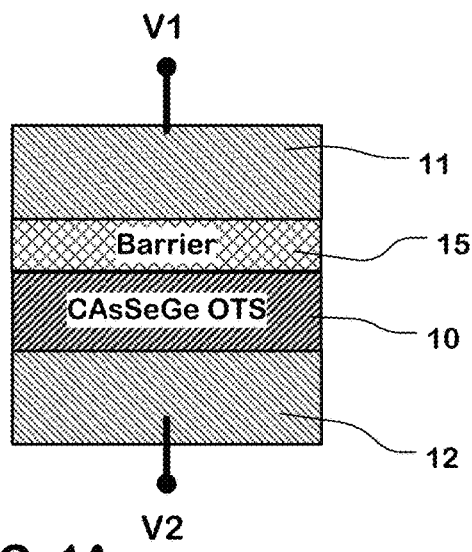
FIG. 1A is a simplified diagram of a cross-section of a switching device including a switching layer of a composition comprising CAsSeGe material.

FIG. 1A is a simplified diagram of a switching device that includes a switching layer 10 of a CAsSeGe material as described herein. The switching device includes a first electrode 11 and a second electrode 12, with a barrier layer 15 and a switching layer 10 in series between the first electrode and the second electrode. A voltage V1 can be applied to the first electrode 11, and a voltage V2 can be applied to the second electrode 12.

Figure 1B:
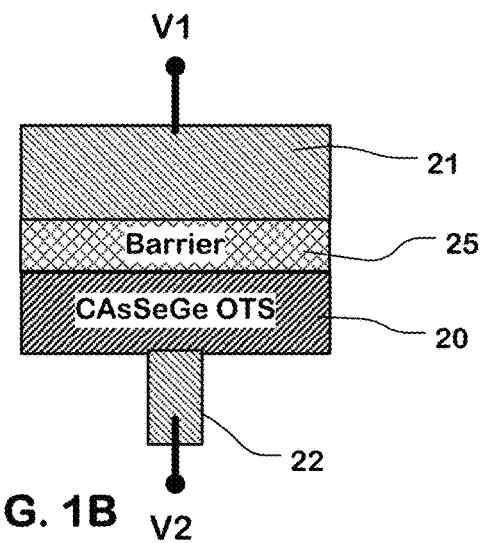
FIG. 1B is a simplified diagram of a cross-section of a switching device including a composition as described herein in a "mushroom cell" configuration.

FIG. 1B is a simplified diagram of a switching device in a "mushroom cell" configuration, including a switching layer 20 which includes a first electrode 21 and a second electrode 22, with a barrier layer 25 and a switching layer 20 in series between the first electrode 21 and the second electrode 22. The second electrode 22, in this example, is coupled through a dielectric layer to a conductor that can be configured for connection to a driver or other voltage source used for operating the switching device. In the "mushroom cell" configuration, the second electrode 22 has a contact area with the switching layer 20 that is much smaller than the corresponding contact area of the first electrode 21 with the switching layer 20. The smaller contact area serves to concentrate the current through the switching layer in a smaller region, which can enable lower current operation of the switching element.

For the switching devices of FIG. 1A and FIG. 1B, when the voltage (V1-V2) across the switching layer between the first electrode 11, 21 and the second electrode 12, 22 exceeds a threshold voltage of the switching layer, then the switching device is turned on. When the voltage across the first electrode 11, 21 and the second electrode 12, 22 is below a holding threshold voltage of the switching layer, the switching device returns to a high impedance, off state. The switching devices shown in FIGS. 1A and 1B can have a highly nonlinear current versus voltage characteristic, making them suitable for use as a switching element in a high density memory device, and in other settings.

The barrier layer 15 can provide one or more of resistance, adhesion and diffusion barrier functions. The barrier layer 15 may have a layer of conductive material with a thickness of about 5 to about 50 nm, preferably about 20 nm. The barrier layer 15 can be a composition including carbon (including essentially pure carbon), or of silicon and carbon on a top surface of the ovonic threshold switch material, or other materials. Other example materials for the barrier layer 15 can be a metal nitride, such as titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (WAlN), tantalum silicon nitride (TaSiN), or tantalum aluminum nitride (TaAlN). In addition to metal nitrides, the barrier layer 15 can comprise materials such as carbon, doped polysilicon, tungsten (W), copper (Cu), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), or tantalum oxynitride (TaON).

A second barrier layer can be disposed on a second surface (e.g., bottom surface) opposite said first mentioned surface, of the ovonic threshold switch material, in some embodiments.

The switching layer 10, 20 is an ovonic threshold switch having a composition of carbon C, arsenic As, selenium Se and germanium Ge thermally stable to temperatures in excess of 400° C. A class of compositions is described useful as a switching layer 10 in an integrated circuit, in which the carbon C, arsenic As, selenium Se and germanium Ge are combined in amounts and with a thickness in the layer 10, effective to have a crystallization transition temperature in excess of 400° C. In some embodiments a crystallization transition temperature can be in excess of 450° C., and in some embodiments a crystallization transition temperature can be in excess of 500° C.

Figure 2:
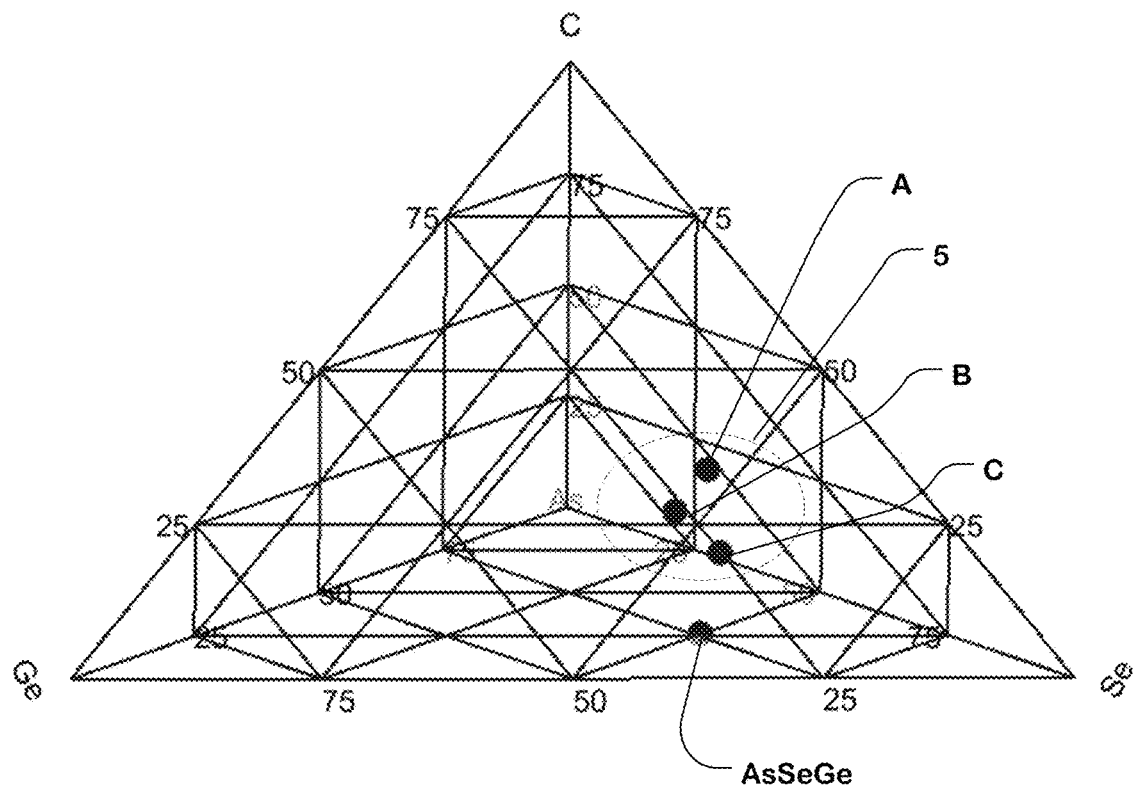
FIG. 2 is a quaternary composition diagram illustrating a class of materials described herein.

FIG. 2 is a pyramid-shaped, quaternary composition diagram for materials C, As, Se and Ge. In the diagram, concentrations of arsenic, selenium and germanium are represented by locations on the three axes at the base of the pyramid with arsenic at the back in this diagram. Concentration of carbon is represented by vertical position in the pyramid.

The diagram roughly illustrates a region 5 that represents a class of CAsSeGe materials stable at high temperature and having threshold voltage, a low off-state current, and switching endurance at thicknesses below 100 nm, and more preferably for some implementations at thicknesses below 50 nm, which thicknesses can be critical for use in integrated circuit memory cells as described herein.

In FIG. 2, materials A, B and C along with a material of AsSeGe are plotted, which have compositions as shown in the following table.

|        | C (at. %) | As (at. %) | Se (at. %) | Ge (at. %) |
|--------|-----------|------------|------------|------------|
| AsSeGe | 0         | 26.3       | 49.6       | 24.1       |
| A      | 28.3      | 20.2       | 39.4       | 12.1       |
| B      | 19.5      | 27.2       | 37.0       | 16.3       |
| C      | 14.5      | 20.8       | 47.1       | 8.6        |

Materials A and C in region 5 have been tested with a thickness of 30 nm, demonstrating a surprising and unexpectedly good performance as a switching layer, with good thermal stability at temperatures in excess of 400° C. Testing of materials A and C demonstrates a trend of increasing crystallization transition temperature with increasing carbon concentrations establishing an expectation that a range of materials in region 5 can have high thermal stability and high crystallization transition temperatures.

For comparison, the AsSeGe material in the table above has a threshold voltage Vth of about 4 V, and Ioff at 2V about 7 pA with a thickness of 30 nm. Material A has a threshold voltage Vth of about 2.95 V, and Ioff at 2V about 2 nA with a thickness of 30 nm. Material C has a threshold voltage Vth of about 2.6 V, and Ioff at 2V about 0.6 nA with a thickness of 30 nm. Thus Materials A and C have characteristics suitable for use as OTS devices and as OTS switch elements in memory devices at thicknesses below 100 nm, and more preferably for some implementations at thicknesses below 50 nm, and demonstrate increasing threshold voltage with increasing carbon. Material B therefore also should be suitable for use as OTS devices and as OTS switch elements in memory devices with characteristics between those of Material A and Material C. Embodiments can be used as a switching layer having a thickness less than 50 nm, and the composition includes As, Se, Ge and C in amounts effective to switch using an applied voltage pulse less than 5 ns in duration at a threshold voltage Vt<4V A class of compositions is described including arsenic As, selenium Se, germanium Ge and carbon C, with the C in a range based on extrapolation of the experimental results of 10 at % to 30 at % of the composition, which are stable at surprising and unexpectedly high temperatures in excess of 400° C. In some embodiments the materials are combined in concentrations effective to have a crystallization transition temperature can be in excess of 450° C., and in some embodiments the materials are combined in concentrations effective to have a crystallization transition temperature can be in excess of 500° C.

Materials A, B and C and generally in this region 5 with concentrations of Arsenic between 20 and 21 at %, are stable at surprising and unexpectedly high temperatures in excess of 400° C. In some embodiments a crystallization transition temperature can be in excess of 450° C., and in some embodiments a crystallization transition temperature can be in excess of 500° C.

Materials generally in this region 5 include a class of compositions based on extrapolation of the experimental results, of CAsSeGe, including C in a range of 10 at % to 30 at %, arsenic As in a range of 20 at % to 35 at %, selenium Se in a range of 35 at % to 55 at % and germanium Ge in a range of 8 at % to 25 at %. In members of this class of compositions, C, As, Se and Ge can be combined in a switching layer, using a thickness of the layer less than 50 nm, in amounts effective to be stable at surprising and unexpectedly high temperatures in excess of 400° C., and to have in some embodiments a crystallization transition temperature in excess of 450° C., and to have in some embodiments a crystallization transition temperature in excess of 500° C. The relative concentrations of the elements for a particular member of this class of compositions can be chosen so that they are effective to achieve one or more of the characteristics including the high thermal stability, high crystallization transition temperature, high threshold voltage, low-off state current, fast switching and high endurance demonstrated by the testing described herein.

To test thermal stability of Material A, thin film of material A was deposited on a substrate and subject to increasing temperatures. Visual inspection shows that the thin film appears undamaged to temperatures in excess of 450° C., with discoloration or roughness suggesting thermal degradation occurring around 550° C. Comparable testing of the three element AsSeGe composition in the table above showed discoloration or roughness damage below 380° C., even though the crystallization transition as deduced from x-ray diffraction measurements did not appear to occur until about 500° C. Discoloration is believed to occur due to surface roughness caused by localized phase separation, delamination or other physical changes in the material, demonstrating thermal degradation because of a lack of thermal stability.

Figure 3:
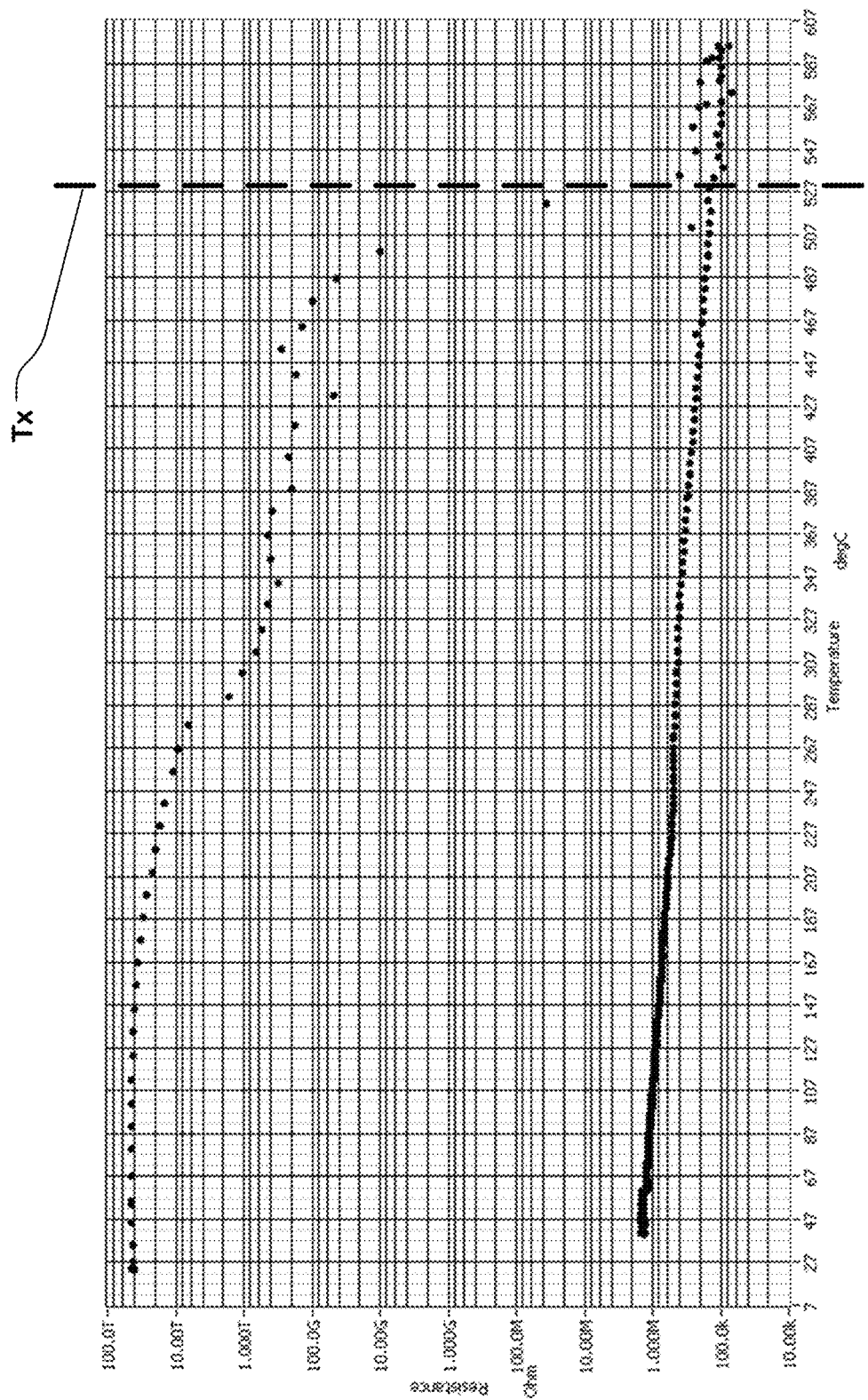
FIG. 3 is a graph of resistance versus temperature for Material A, showing a crystallization transition temperature.

FIG. 3 is a graph of resistance versus temperature for material A, showing a very high resistance at lower temperatures along the top row of samples, transitioning to low resistance around 530° C. and holding at the low resistance as the material was cooled. This graph shows a crystallization transition temperature Tx for material A in excess of 500° C.

Though not shown in FIG. 3, Material C was also tested using a thin film on a substrate. As temperature was ramped up in excess of 530°, no crystallization was observed. Also, no discoloration or thermal damage was seen on visual inspection.

Figure 4:
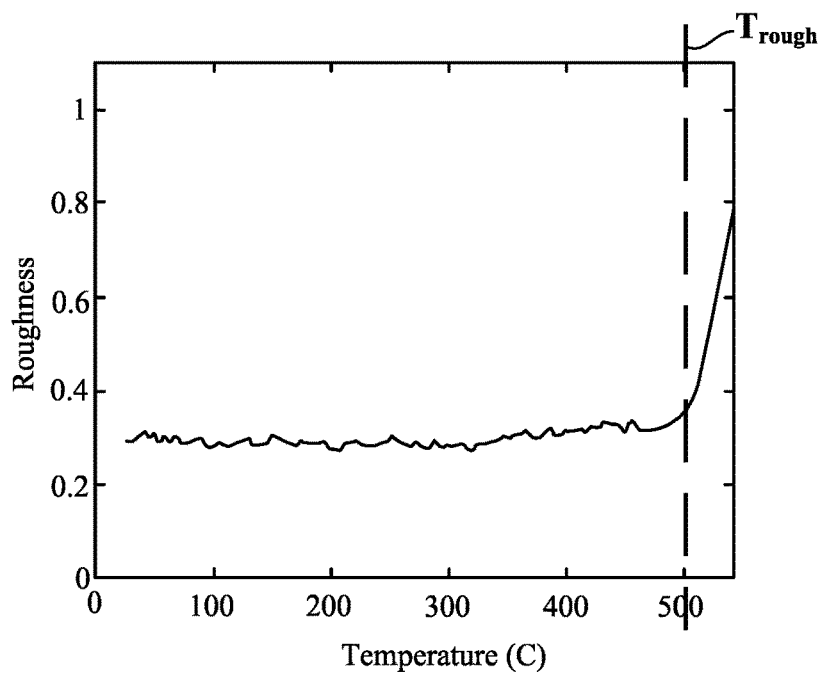
FIG. 4 is a graph of surface roughness versus temperature for Material C, showing thermal stability.

FIG. 4 is a graph of temperature versus surface roughness for Material C, showing that the thermal stability of the material enables exposure to temperatures of above 400° C. as mentioned above in connection with BEOL manufactures processes, above 450° C., and above 500° C. or more without changes in surface roughness to provide substantial manufacturing margins in thermal stability.

Device performance is also tested for a cell such as that shown in FIG. 1B using a 30 nm thick layer of Material C, a tungsten bottom electrode, a carbon barrier layer over the OTS material, and a tungsten top electrode.

Figure 5:
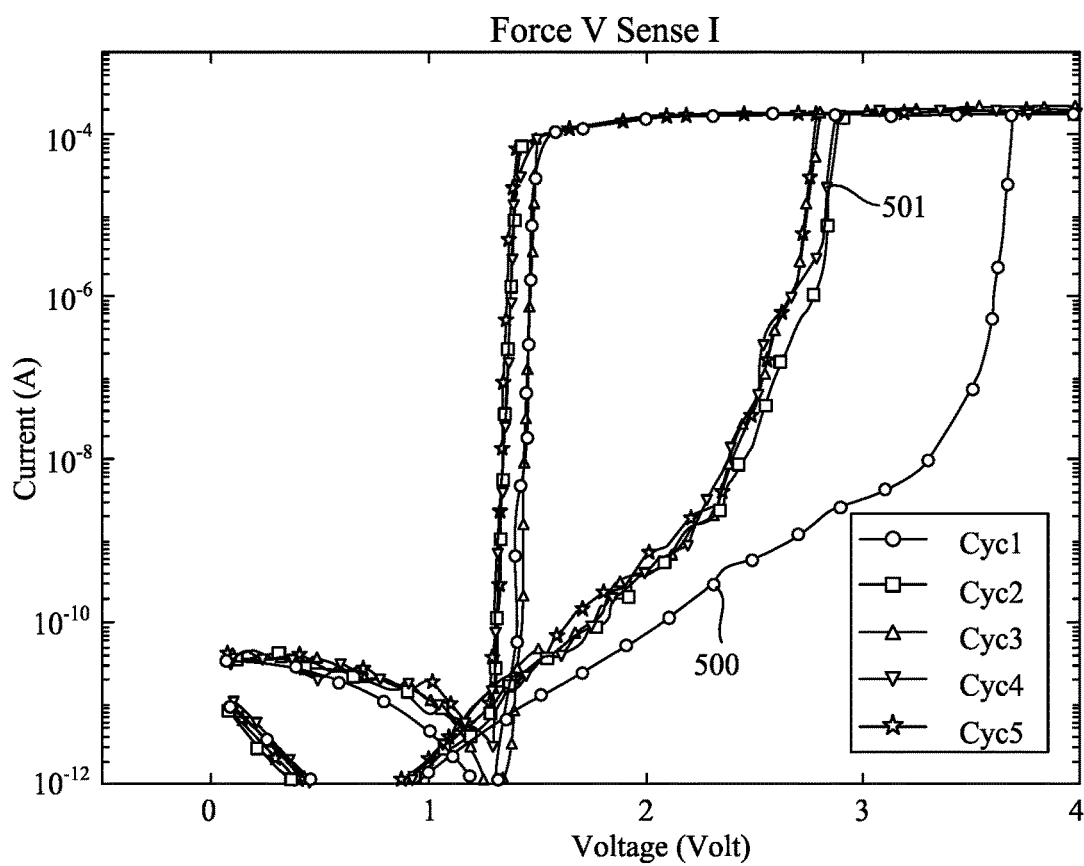
FIG. 5 is a force V/sense I graph for cycling of an OTS switch comprising materials described herein.

A force voltage/sense current IV graph for cycling of the switch is shown in FIG. 5. The plot is generated by sweeping the voltage from 0V to 4V, and then from 4V to 0V, and measuring the current I. In the plot, a maximum of 100 µA is set for compliance so the current is constant even as voltage increases for this region. The first cycle 501 is a forming cycle, in which the threshold voltage is relatively high. In subsequent cycles the switch switches consistently at threshold of about 2.6 V with a holding voltage Vh at about 1.4 V.

Figure 6:
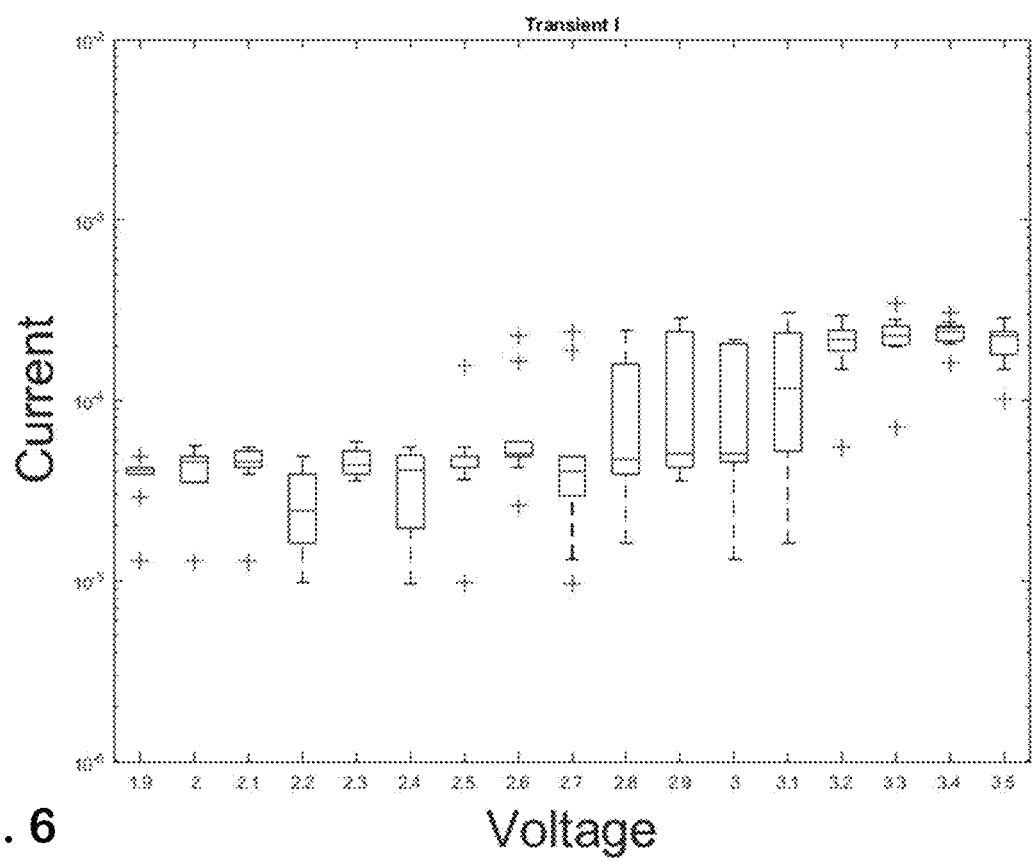
FIG. 6 is a box plot for an OTS switch as described herein, showing transient threshold voltage over 3V.

FIG. 6 is a box plot for a 5 nsec switching pulse, showing successful switching at about 3.2 volts in 5 nanoseconds for material C.

Figure 7:
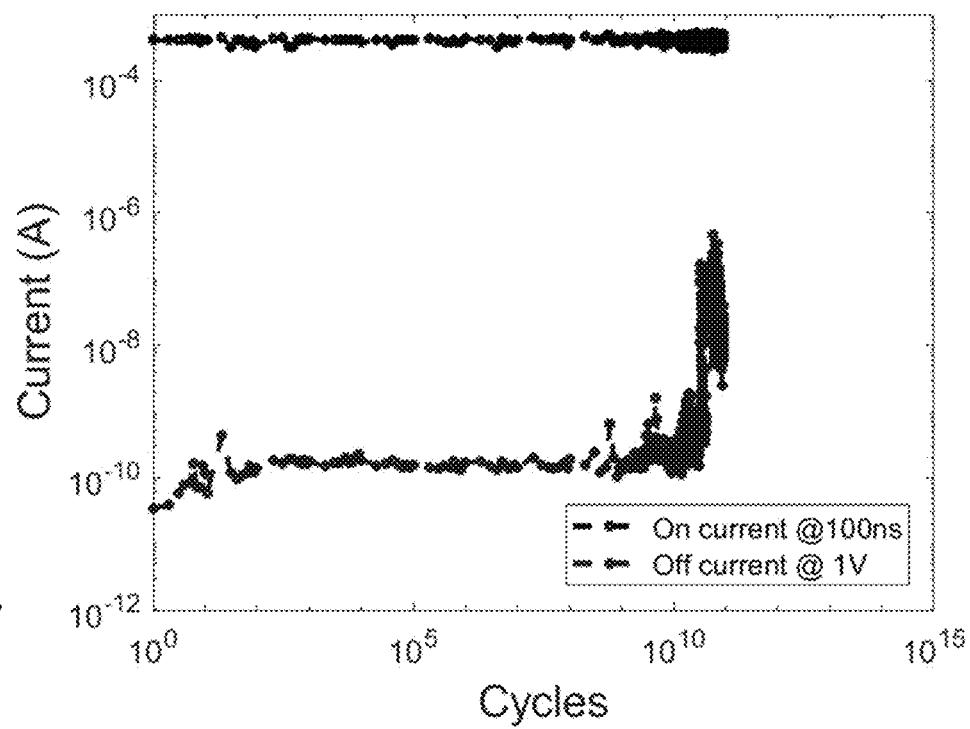
FIG. 7 is a graph of on-current and off-current levels showing endurance in excess of $10^9$ cycles.

FIG. 7 is a graph showing endurance, showing on-current and off-current levels for Material C, without breakdown for up to $10^9$ cycles, in the tested sample.

This data from testing of material C suggests that materials A and B, and other combinations of CAsSeGe, and other materials in region 5 as discussed above can have combinations of concentrations effective to have similar behaviors with fast switching and good endurance, along with high crystallization temperatures as discussed herein.

Figure 8:
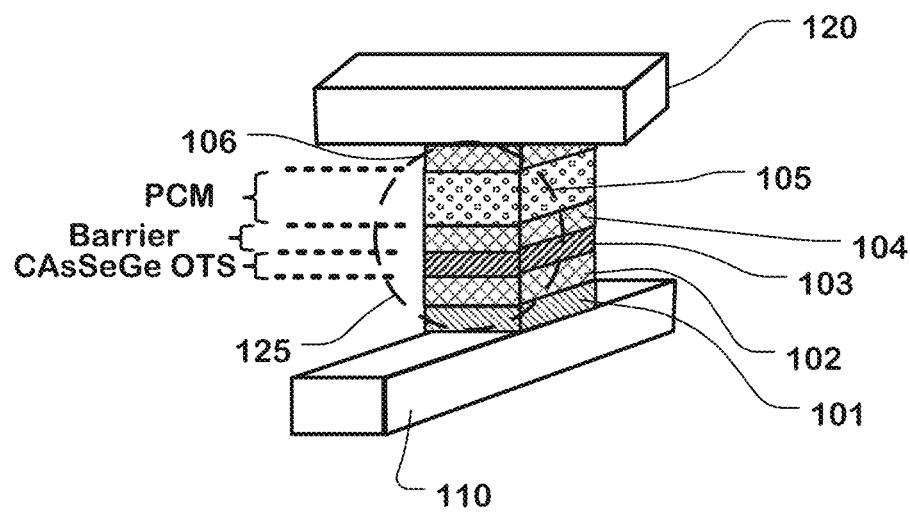
FIG. 8 is a simplified 3D perspective of a memory cell in a crosspoint memory device including a switching device as described herein.

FIG. 8 illustrates an example memory cell 125 which comprises a multi-layer pillar disposed in the crosspoint of a first access line 110 and a second access line 120.

The pillar in this example includes a bottom electrode layer 101, such as a metal, metal nitride, a doped semiconductor, or the like, on the first access line 110.

A barrier layer 102 is disposed on the bottom electrode layer 101. In some embodiments, the barrier layer 102 comprises a composition such as carbon or silicon and carbon as described herein. The barrier layer 102 can be, for example, 15 to 30 nm thick.

An OTS switching layer 103 is disposed on the barrier layer 102. The OTS switching layer 103 can comprise an OTS material such as described herein with thermal stability up to temperatures in excess of 400° C., including the materials in the classes of materials described above with reference to FIG. 2. The OTS switching layer can be, for example, a layer of CAsSeGe material 15 to 45 nm thick, and preferably less than 50 nm thick.

A barrier layer 104 is disposed on the OTS switching layer 103, and can be called a capping layer for the OTS material. The barrier layer 104 is a barrier layer that comprises a composition of carbon, or silicon and carbon as discussed herein. The barrier layer 104 can be, for example, 15 to 30 nm thick.

A memory material layer 105 is disposed on the barrier layer 104. The memory material can comprise a programmable resistance material. In embodiments of the technology, the memory material comprises a phase change memory material, such as GST (e.g., $Ge_2Sb_2Te_5$), silicon oxide doped GST, nitrogen doped GST, silicon oxide doped GaSbGe, or other phase change memory materials. The memory material layer 105 can have a thickness selected according to the particular material utilized. For phase change material, an example range of thicknesses can be 5 to 50 nm thick. Some examples of memory materials that may be useful are disclosed in Ovshinsky, U.S. Pat. No. 5,687,112 at columns 11-13, which examples are incorporated by reference.

The memory material layer 105 can comprise a layer of chalcogenide alloy with additives to modify conductivity, transition temperature, melting temperature, and other properties. Representative additives can include nitrogen (N), silicon (Si), oxygen (O), silicon dioxide (SiOx), silicon nitride (SiN), copper (Cu), silver (Ag), gold (Au), aluminum (Al), aluminum oxide (Al2O3), tantalum (Ta), tantalum oxide (TaOx), tantalum nitride (TaN), titanium (Ti), and titanium oxide (TiOx).

In some embodiments, other programmable resistance memory elements can be implemented, such as metal-oxide resistive memories, magnetic resistive memories and conducting-bridge resistive memories, or other types of memory devices.

The first access lines (bit lines) and the second access lines (word lines) can comprise a variety of metals, metal-like materials and doped semiconductors, or combinations thereof. Embodiments of the first and second access lines can be implemented using one or more layers of materials like tungsten (W), aluminum (Al), copper (Cu), titanium nitride (TiN), tantalum nitride (TaN), tungsten nitride (WN), doped polysilicon, cobalt silicide (CoSi), Tungsten silicide (WSi), TiN/W/TiN, and other materials. For example, the thicknesses of the first access lines and the second access lines can range from 10 to 100 nm. In other embodiments, the first access lines and the second access lines can be very thin, or much thicker. The material selected for the second access lines is preferably selected for compatibility with the memory element 105 and top barrier layer 106. Likewise, the material selected for the first access lines is preferably selected for compatibility with the layer 101 and barrier layer 102.

In another embodiment, a bottom electrode like that shown in FIG. 3, having a smaller contact surface than the surface of the memory element, is interposed between the memory material layer 105 and the switching layer 103 or between the memory material layer 105 and the top barrier layer 106. As such, an increased current density at the contact in the memory element can be achieved.

A top barrier layer 106 is disposed on the memory material layer 105. In some embodiments, the top barrier layer 106 comprises a composition including silicon and carbon as described herein. The top barrier layer 106 can be, for example, 15 to 30 nm thick.

Example materials, other than a combination of silicon and carbon as described herein, for the first barrier layer 102, second barrier layer 104 and the top barrier layer 106, can be a metal nitride, such as titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (WAlN), tantalum silicon nitride (TaSiN), tantalum aluminum nitride (TaAlN). In addition to metal nitrides, the first barrier layer 102 and the top barrier layer 106 can comprise materials such as carbon, doped polysilicon, tungsten (W), copper (Cu), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), or tantalum oxynitride (TaON).

The first access lines (bit lines) and the second access lines (word lines) can comprise a variety of metals, metal-like materials and doped semiconductors, or combinations thereof. Embodiments of the first and second access lines can be implemented using one or more layers of materials like tungsten (W), aluminum (Al), copper (Cu), titanium nitride (TiN), tantalum nitride (TaN), tungsten nitride (WN), doped polysilicon, cobalt silicide (CoSi), Tungsten silicide (WSi), TiN/W/TiN, and other materials. For example, the thicknesses of the first access lines and the second access lines can range from 10 to 100 nm. In other embodiments, the first access lines and the second access lines can be very thin, or much thicker.

The first electrode and the dielectric layer can be formed, for example, using methods, materials, and processes as disclosed in U.S. Pat. No. 8,138,028 entitled "Method for Manufacturing a Phase Change Memory Device with Pillar Bottom Electrode", which is incorporated by reference herein.

Alternatively, the switching devices can be organized in a crosspoint architecture, such as described in U.S. Pat. No. 6,579,760, entitled Self-Aligned, Programmable Phase Change Memory, issued 17 Jun. 2003, which is incorporated by reference herein. The first electrode can be the access lines, such as word lines and/or bit lines. In such architecture, the access devices are arranged between the switching devices and the access lines.

Figure 9:
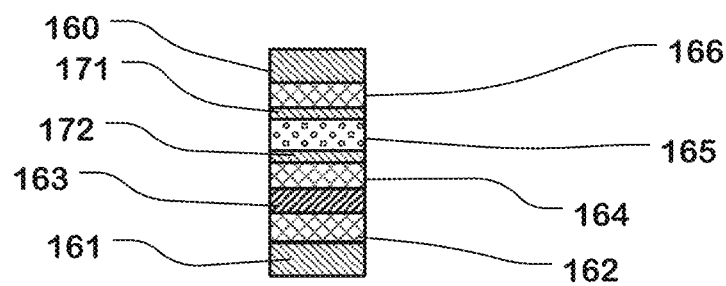
FIG. 9 is a simplified layer diagram for an alternative stack configuration of a crosspoint memory device including a switching device as described herein.

FIG. 9 shows an alternative stack of materials including a CAsSeGe OTS layer as described herein and a memory layer. The stack of materials in FIG. 9 can be used in a crosspoint structure as shown in FIG. 8. There are a variety of stacks of material, of which FIGS. 8 and 9 show examples, which can be used.

In FIG. 9, the stack includes a bottom electrode layer 161, such as a metal, metal nitride, a doped semiconductor, or the like, on the first access line (not shown).

A barrier layer 162 is disposed on the bottom electrode layer 161. In some embodiments, the barrier layer 162 comprises a composition such as silicon and carbon as described herein. The barrier layer 162 can be, for example, 15 to 30 nm thick.

An OTS switching layer 163 is disposed on the barrier layer 162. The OTS switching layer 163 can comprise an OTS material such as described herein with thermal stability up to temperatures in excess of 400° C., including the materials in the classes of materials described above with reference to FIG. 2. The OTS switching layer can be, for example, a layer of CAsSeGe material 15 to 45 nm thick, and preferably less than 50 nm thick.

A barrier layer 164 is disposed on the OTS switching layer 163, and can be called a capping layer for the OTS material. The barrier layer 164 can comprise a composition of silicon and carbon as discussed herein. The barrier layer 164 can be, for example, 15 to 30 nm thick.

A memory material layer 165 is disposed over the barrier layer 164. The memory material can comprise a programmable resistance material, as discussed with reference to FIG. 8. Capping layer 172, comprising for example tungsten or another conductor, can be disposed between the memory material layer 165 and the barrier layer 164. Also, a capping layer 171 comprising, for example, tungsten or other conductor, can be over the memory material layer 165.

In the stack in FIG. 9, a barrier layer 166 comprising carbon and silicon, for example, overlies the capping layer 171. A top electrode layer 160 is disposed over the barrier layer 166. In another embodiment, a bottom electrode like that shown in FIG. 3, having a smaller contact surface than the surface of the memory element, is interposed between the memory material layer 165 and the switching layer 163 or between the memory material layer 165 and the barrier layer 166. As such, an increased current density at the contact in the memory element can be achieved.

Figure 10:
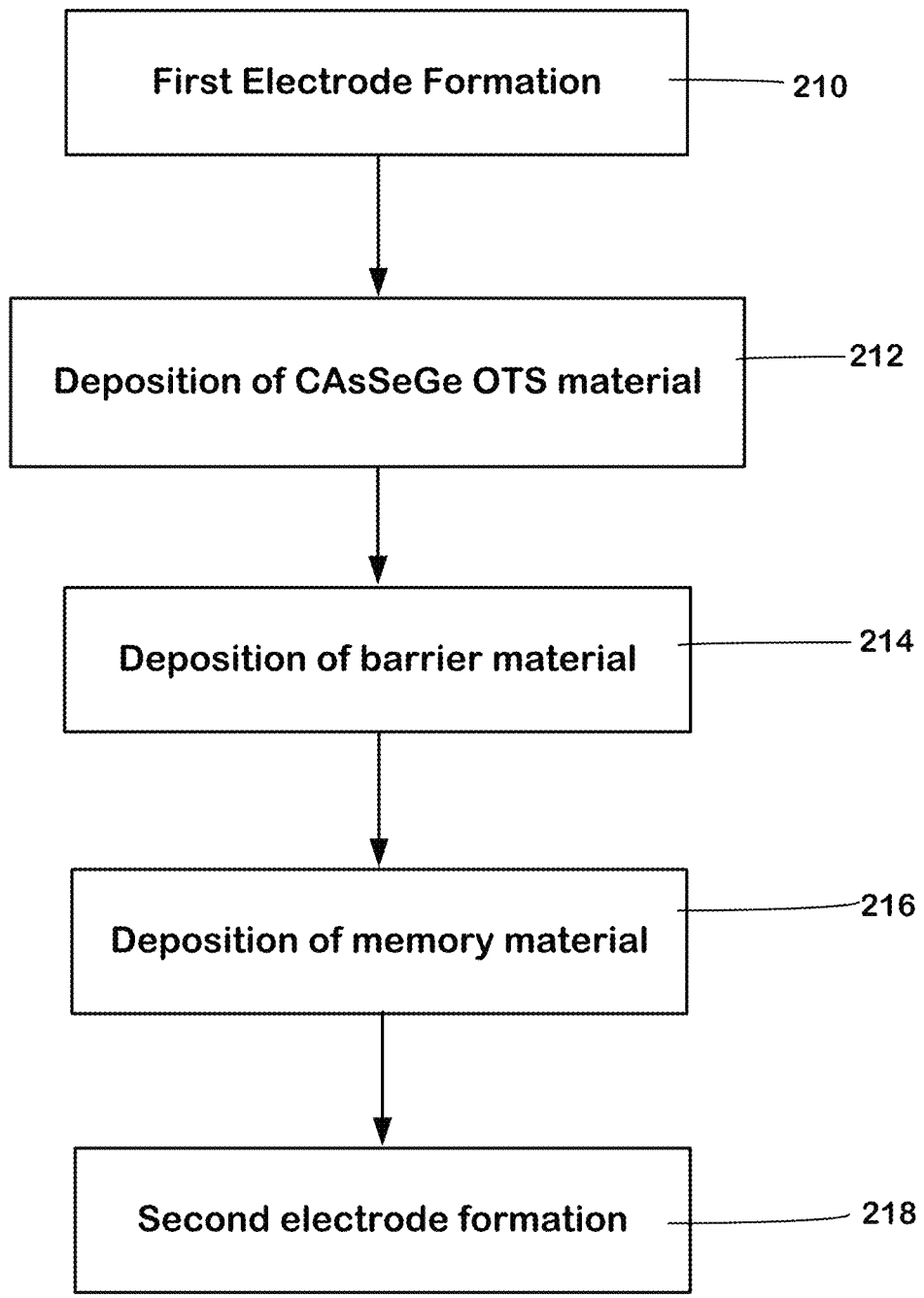
FIG. 10 is a simplified flowchart for manufacturing a switching device as described herein.

FIG. 10 is a simplified flowchart of a manufacturing process for a memory device including a CAsSeGe OTS material as described herein.

At step 210, a first electrode is formed including materials as described above, with an optional barrier layer, and patterning techniques such as discussed in the references incorporated by reference.

At step 212, a switching layer including a CAsSeGe OTS material, including materials described above, for example, is formed in a sputtering chamber of a sputtering system, having targets consisting of the selected materials. In some embodiments, the CAsSeGe material is deposited using targets consisting of the selected materials simultaneously to form the combination of the elements in the amounts effective to be stable at high temperature as discussed herein.

At step 214, deposition of a barrier layer including, for example, a composition of silicon and carbon as described above is formed, so that it acts as a barrier layer against oxidation of the switching layer. In a preferred example, the composition is formed by in situ sputtering in the same sputtering chamber as the OTS material, or otherwise formed without exposure of the OTS material to an oxidizing atmosphere.

At step 216, a memory material is formed on the barrier layer. The memory material can be a programmable resistance material, like a phase change material, or other materials as described above.

At step 218, a second electrode is formed. The second electrode can be formed by deposition and patterned etch, for example, of a conductive material.

A device can be completed using back-end-of-line (BEOL) processing. The BEOL process is to complete the semiconductor process steps of the chip, including in some manufacturing technologies, exposing the materials to temperatures on the order of 400° C. or more. The BEOL processes can be standard processes as known in the art, and the processes performed depend upon the configuration of the chip in which the switching device is implemented. Generally, the structures formed by BEOL processes may include contacts, inter-layer dielectrics and various metal layers for interconnections on the chip, including circuitry to couple the switching device to peripheral circuitry. As a result of these processes, control circuits and biasing circuits as shown in FIG. 11 are formed on the device.

Figure 11:
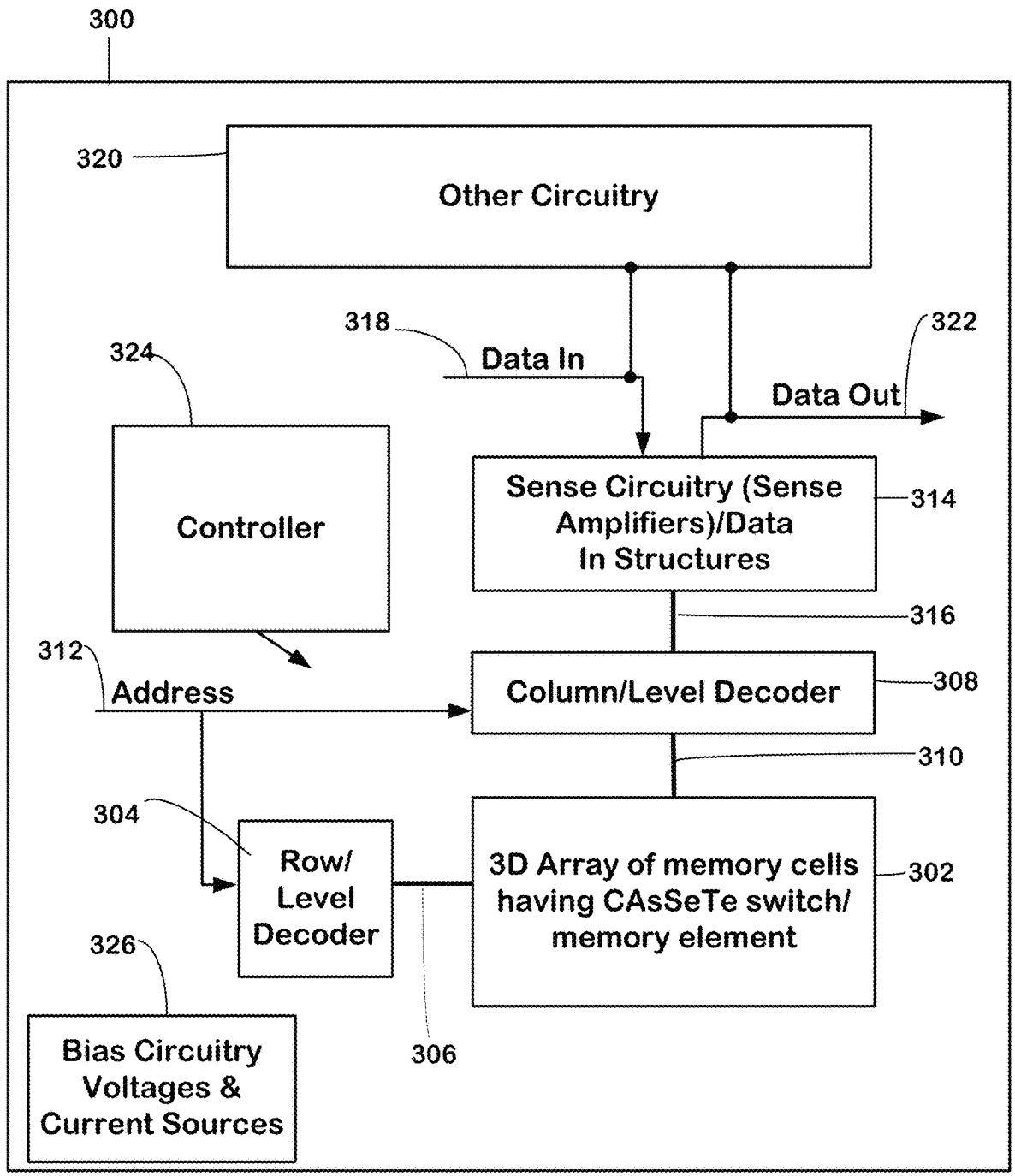
FIG. 11 is a simplified block diagram of an integrated circuit memory device comprising a 3D memory utilizing switching devices as described herein.

FIG. 11 is a simplified block diagram of an integrated circuit 300 including a 3D array 302 of crosspoint memory cells having CAsSeGe switching layers (SSL switch) as described herein, with programmable resistance memory layers. A row/level line decoder 304 having read, set and reset modes is coupled to, and in electrical communication with, a plurality of word lines 306 arranged in levels and along rows in the array 302. A column/level decoder 308 is in electrical communication with a plurality of bit lines 310 arranged in levels and along columns in the array 302 for reading, setting, and resetting the memory cells in the array 302. Addresses are supplied on bus 312 to row/level decoder 304 and column/level decoder 308. Sense circuitry (Sense amplifiers) and data-in structures in block 314, including voltage and/or current sources for the read, set, and reset modes are coupled to bit line decoder 308 via data bus 316. Data is supplied via a data-in line 318 from input/output ports on integrated circuit 300, or from other data sources internal or external to integrated circuit 300, to data-in structures in block 314. Other circuitry 320 may be included on integrated circuit 300, such as a general purpose processor or special purpose application circuitry, or a combination of modules providing system-on-a-chip functionality supported by array 302. Data is supplied via a data-out line 322 from the sense amplifiers in block 314 to input/output ports on integrated circuit 300, or to other data destinations internal or external to integrated circuit 300.

A controller 324 implemented in this example, using a bias arrangement state machine, controls the application of bias circuitry voltage sources and current sources 326 for the application of bias arrangements, including read, set, reset and verify voltages, and/or currents for the word lines and bit lines. The controller includes control circuitry configured for switching layers as described herein, depending on the structure and composition of the switching layer, by applying a voltage to a selected memory cell so that the voltage on the switch in the select memory cell is above the threshold, and a voltage to an unselected memory cell so that the voltage on the switch in unselected memory cell is below the threshold during a read operation or other operation accessing the selected memory cell. Also, the voltage applied to unselected cells during a read of the selected memory cells is set such that the off-state current is preferably less than 2 nA or less than 1 nA depending on the structure and composition of the switching layer during a read operation accessing the selected memory cell.

Controller 324 may be implemented using special-purpose logic circuitry as known in the art. In alternative embodiments, controller 324 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 324.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A switching device, comprising:
   a first electrode;
   a second electrode; and
   a switching layer between the first and second electrodes, the switching layer comprising a composition of arsenic As in a range of 20 at % to 35 at %, selenium Se in a range of 35 at % to 55 at %, germanium Ge in a range of 8 at % to 25 at % and carbon C, the C in a range of 10 at % to 30 at % of the composition.

2. The device of claim 1, wherein the composition includes As, Se, Ge and C in amounts effective to be stable at temperatures greater than 400° C.

3. The device of claim 1, wherein the switching layer has a thickness less than 50 nm, and the composition includes As, Se, Ge and C in amounts effective to switch using an applied voltage pulse less than 5 ns in duration at a threshold voltage Vt<4V.

4. The device of claim 1, wherein the switching layer has a thickness less than 50 nm, and the composition includes As, Se, Ge and C in amounts effective to have a crystallization transition temperature greater than 400° C.

5. The device of claim 1, wherein the switching layer has a thickness less than 50 nm, and the composition includes As, Se, Ge and C in amounts effective to have a crystallization transition temperature greater than 450° C.

6. The device of claim 1, wherein the switching layer has a thickness less than 50 nm, and the composition includes As, Se, Ge and C in amounts effective to have a crystallization transition temperature greater than 500° C.

7. The device of claim 1, wherein the switching layer is less than 50 nm thick.

8. The device of claim 1, wherein the switching layer has a thickness in a range of 15 to 45 nm, inclusive.

9. A memory device, comprising:
   a first electrode;
   a second electrode;
   a memory element in contact with the first electrode;
   a switching layer in series with the memory element between the first and second electrodes, the switching layer comprising a composition of arsenic As in a range of 20 at % to 35 at %, selenium Se in a range of 35 at % to 55 at %, germanium Ge in a range of 8 at % to 25 at % and carbon C, the C in a range of 10 at % to 30 at % of the composition; and
   a barrier layer between the memory element and the switching layer.

10. The device of claim 9, wherein the composition includes As, Se, Ge and C in amounts effective to be stable at temperatures greater than 400° C.

11. The device of claim 9, wherein the switching layer has a thickness less than 50 nm, and the composition includes As, Se, Ge and C in amounts effective to switch using an applied voltage pulse less than 5 ns in duration at a threshold voltage Vt<4V.

12. The device of claim 9, wherein the switching layer has a thickness less than 50 nm, and the composition includes As, Se, Ge and C in amounts effective to have a crystallization transition temperature greater than 400° C.

13. The device of claim 9, wherein the switching layer has a thickness less than 50 nm, and the composition includes As, Se, Ge and C in amounts effective to have a crystallization transition temperature greater than 450° C.

14. The device of claim 9, wherein the switching layer has a thickness less than 50 nm, and the composition includes As, Se, Ge and C in amounts effective to have a crystallization transition temperature greater than 500° C.

15. The device of claim 9, wherein the switching layer is less than 50 nm thick.

16. The device of claim 9, wherein the switching layer has a thickness in a range of 15 to 45 nm, inclusive.

17. The device of claim 9, wherein the memory element comprises a phase change memory material.

18. A switching device, comprising:
   a first electrode;
   a second electrode; and
   a memory element and a switching layer in electrical series with the first and second electrodes, the switching layer comprising a composition of arsenic As, selenium Se, germanium Ge and carbon C, wherein the switching layer has a thickness less than 50 nm, and the composition includes As, Se, Ge and C in amounts effective to switch using an applied voltage pulse less than 5 ns in duration at a threshold voltage Vt<4V.

* * * * *